(12) United States Patent
Cho et al.

(10) Patent No.: US 10,681,819 B2
(45) Date of Patent: *Jun. 9, 2020

(54) EMBEDDING INTO PRINTED CIRCUIT BOARD WITH DRILLING

(71) Applicant: Infineon Technologies Austria AG, Villach (AT)

(72) Inventors: Eung San Cho, Torrance, CA (US); Danny Clavette, Greene, RI (US); Darryl Galipeau, Warwick, RI (US)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/224,578

(22) Filed: Dec. 18, 2018

(65) Prior Publication Data

US 2019/0124773 A1    Apr. 25, 2019

Related U.S. Application Data

(63) Continuation of application No. 15/633,154, filed on Jun. 26, 2017, now Pat. No. 10,206,286.

(51) Int. Cl.
*H01L 23/48* (2006.01)
*H05K 3/00* (2006.01)
(Continued)

(52) U.S. Cl.
CPC ....... *H05K 3/0038* (2013.01); *H01L 23/5389* (2013.01); *H01L 24/19* (2013.01);
(Continued)

(58) Field of Classification Search
CPC .... H05K 1/113; H05K 3/0038; H05K 3/0047; H05K 1/142; H01L 23/5389
(Continued)

(56) References Cited

U.S. PATENT DOCUMENTS 5,111,278 A     5/1992  Eichelberger
5,241,456 A  *  8/1993  Marcinkiewicz ... H01L 23/5384
                                                  174/250

(Continued)

OTHER PUBLICATIONS

Extended Search Report from counterpart European Application No. 18177646.9, dated Nov. 28, 2018, 8 pp.
(Continued)

*Primary Examiner* — Nitin Parekh
(74) *Attorney, Agent, or Firm* — Shumaker & Sieffert, P.A.

(57) ABSTRACT

In one example, a method includes drilling a cavity into each contact pad of one or more contact pads of a first printed circuit board to form one or more cavities. The first printed circuit board includes an embedded integrated circuit and one or more metal layers. The method further includes forming one or more first metal layers for a second printed circuit board below a bottom surface of the first printed circuit board. The method further includes forming an electrically conductive material in the one or more cavities. The electrically conductive material electrically couples the one or more contact pads of the first printed circuit board to the second printed circuit board. The method further includes forming one or more second metal layers for the second printed circuit board above a top surface of the first printed circuit board.

20 Claims, 7 Drawing Sheets

(51) Int. Cl.
  *H01L 23/538* (2006.01)
  *H01L 23/00* (2006.01)
  *H05K 1/11* (2006.01)
  *H05K 1/14* (2006.01)
  *H05K 1/18* (2006.01)
  *H05K 3/46* (2006.01)
  *H05K 3/32* (2006.01)
  *H05K 3/40* (2006.01)

(52) U.S. Cl.
  CPC .............. *H01L 24/20* (2013.01); *H05K 1/113* (2013.01); *H05K 1/142* (2013.01); *H05K 1/185* (2013.01); *H05K 3/0047* (2013.01); *H05K 3/321* (2013.01); *H05K 3/4007* (2013.01); *H05K 3/4694* (2013.01); *H05K 3/4602* (2013.01); *H05K 2201/09536* (2013.01); *H05K 2201/09563* (2013.01)

(58) Field of Classification Search
  USPC .................................................. 257/701, 774
  See application file for complete search history.

(56) References Cited

U.S. PATENT DOCUMENTS

| | | | |
|---|---|---|---|
| 5,497,033 A | 3/1996 | Fillion et al. | |
| 5,870,289 A | 2/1999 | Tokuda et al. | |
| 6,495,914 B1* | 12/2002 | Sekine | H01L 23/5389 257/723 |
| 7,989,944 B2 | 8/2011 | Tuominen | |
| 7,993,941 B2 | 8/2011 | Huang et al. | |
| 8,710,658 B2 | 4/2014 | Aboush | |
| 2002/0020898 A1 | 2/2002 | Vu et al. | |
| 2003/0137045 A1 | 7/2003 | Sugaya et al. | |
| 2005/0103520 A1 | 5/2005 | Saiki et al. | |
| 2006/0125072 A1 | 6/2006 | Mihara | |
| 2006/0191711 A1 | 8/2006 | Cho et al. | |
| 2010/0243299 A1 | 9/2010 | Kariya et al. | |
| 2011/0019383 A1 | 1/2011 | Aoyama et al. | |
| 2011/0291293 A1* | 12/2011 | Tuominen | H05K 1/0271 257/774 |
| 2013/0221442 A1 | 8/2013 | Joshi | |
| 2015/0334843 A1* | 11/2015 | Jung | H05K 1/183 361/764 |
| 2016/0128197 A1 | 5/2016 | Standing et al. | |
| 2016/0174381 A1* | 6/2016 | Lee | H05K 1/185 361/761 |
| 2017/0186533 A9 | 6/2017 | Wang | |
| 2017/0250466 A1* | 8/2017 | Schlaffer | H01Q 1/38 |
| 2017/0290162 A1* | 10/2017 | Gomez | H05K 1/181 |

OTHER PUBLICATIONS

Prosecution History from U.S. Appl. No. 15/633,154, dated Feb. 26, 2018 through Sep. 12, 2018, 36 pp.

U.S. Appl. No. 15/633,154, by Infineon Technologies. (Inventors: San Eung Cho et al.), filed Jun. 26, 2017.

* cited by examiner

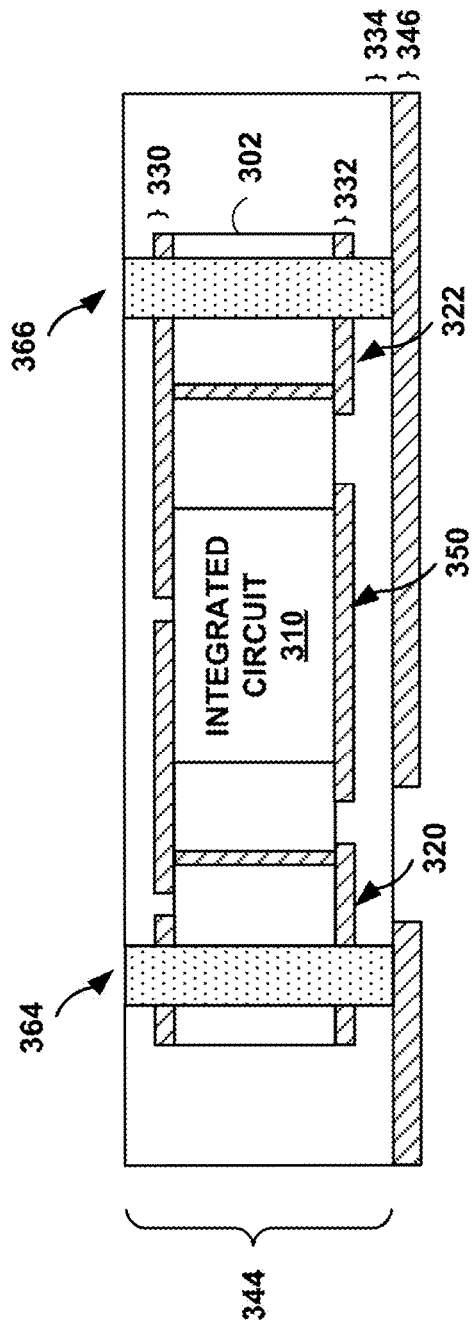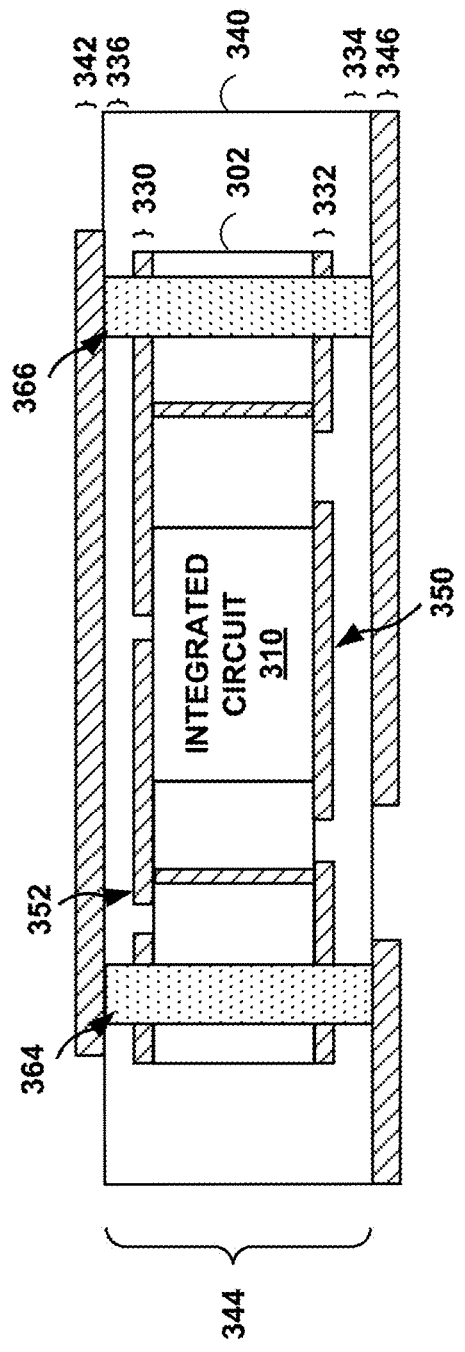

EMBEDDING INTO PRINTED CIRCUIT BOARD WITH DRILLING

PRIORITY CLAIM

This application claims the benefit of U.S. patent application Ser. No. 15/633,154, filed Jun. 26, 2017, the entire content of which is incorporated herein by reference.

TECHNICAL FIELD

This disclosure relates to semiconductor packaging, and more specifically, to semiconductor packages arranged in a printed circuit board.

BACKGROUND

A semiconductor package includes one or more semiconductor devices. The semiconductor package provides outer contacts that are electrically connected to the one or more semiconductor devices. The semiconductor package may be arranged on a printed circuit board. The printed circuit board provides electrical connections for electronic components arranged on the printed circuit board.

SUMMARY

In general, this disclosure is directed to techniques for embedding electrical components into a printed circuit board with drilling. A first printed circuit board includes a contact pad to permit drilling into the first printed circuit board. The drilling simplifies a manufacturing complexity for electrically coupling the first printed circuit board to a second printed circuit board. The first printed circuit board may be embedded into the second printed circuit board.

In an example, a method includes drilling a cavity into each contact pad of one or more contact pads of a first printed circuit board to form one or more cavities. The first printed circuit board includes an embedded integrated circuit and one or more metal layers. The embedded integrated circuit is electrically connected, by the one or more metal layers, to the one or more contact pads. The method further includes forming one or more first metal layers for a second printed circuit board below a bottom surface of the first printed circuit board. One or more first dielectric layers space apart the one or more metal layers of the first printed circuit board from the one or more first metal layers for the second printed circuit board. The method further includes forming an electrically conductive material in the one or more cavities. The electrically conductive material electrically couples the one or more contact pads of the first printed circuit board to the second printed circuit board. The method further includes forming one or more second metal layers for the second printed circuit board above a top surface of the first printed circuit board. The top surface is opposite to the bottom surface. One or more second dielectric layers space apart the one or more metal layers of the first printed circuit board from the one or more second metal layers for the second printed circuit board.

In another example, a semiconductor device includes a first printed circuit board, a second printed circuit board, and one or more drilled vias. The first printed circuit board includes an embedded integrated circuit, one or more metal layers, and one or more contact pads. The embedded integrated circuit is electrically connected, by the one or more metal layers, to the one or more contact pads. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

In another example, a semiconductor device includes a first printed circuit board, a second printed circuit board, and one or more drilled vias. The first printed circuit board includes an embedded integrated circuit, a second die that includes a transistor, one or more metal layers, and one or more contact pads. The first die and the second die are electrically connected, by the one or more metal layers, to the one or more contact pads. The first printed circuit board has a top surface and a bottom surface that is opposite to the top surface. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

Details of these and other examples are set forth in the accompanying drawings and the description below. Other features, objects, and advantages will be apparent from the description and drawings, and from the claims.

BRIEF DESCRIPTION OF DRAWINGS

FIGS. 3A-3F are side-view diagrams illustrating a process for chip embedding into a printed circuit board with drilling, in accordance with some examples of this disclosure.

DETAILED DESCRIPTION

In some systems, an embedded printed circuit board is electrically connected to a host printed circuit board using metal layers. However, connecting metal layers of an embedded printed circuit board to the host printed circuit board may not be possible in some manufacturing processes. For example, the embedded printed circuit board may be manufactured using a relatively expensive process that produces relatively narrow pitch metal layers (e.g., nominal distance between centers of traces) compared to the host printed circuit board. As such, manufacturing processes for producing the host printed circuit board may not be suitable for connecting the host printed circuit board to metal layers of the embedded printed circuit board. Moreover, in this example, a manufacturer may need to align the embedded printed circuit board with the host printed circuit board to ensure that metal layers electrically connect the embedded printed circuit board with the host printed circuit board. However, manufacturing processes for producing the host printed circuit board may not be suitable for alignments for narrow pitch metal layers of the embedded printed circuit board.

In accordance with embodiments described herein, rather than relying solely on metal layers to connect an embedded printed circuit board to a host printed circuit board, the embedded printed circuit board may be configured for drilling to permit a drilled via to electrically couple the embedded printed circuit board to the host printed circuit board.

Figure 1:
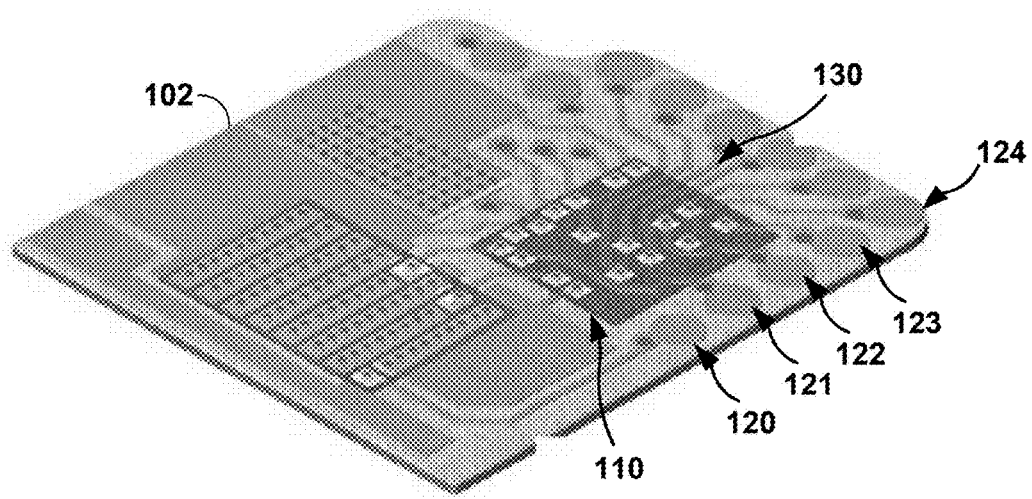
FIG. 1 is an isometric view of a printed circuit board for embedding into a printed circuit board with drilling, in accordance with some examples of this disclosure.

FIG. 1 is an isometric view of a printed circuit board 102 for embedding into a printed circuit board with drilling, in accordance with some examples of this disclosure. As shown printed circuit board 102 includes an embedded integrated circuit 110, contact pads 120-124, and metal layer 130.

Printed circuit board 102 mechanically supports and electrically connects electronic components. For example, printed circuit board 102 may include one or more metal layers formed on a non-conductive substrate. Examples of a non-conductive substrate may include, but is not limited to, glass fiber reinforced epoxy resin (e.g., fiberglass, FR4, etc.), PTFE (Polytetrafluoroethylene), PEN (Polyethylene Naphthalate), PET (Polyethylene Terephthalate, BT laminate (Bismaleimide-Triazine), or another non-conductive substrate. Electronic components may be attached to printed circuit board 102 using an adhesion layer. Such an adhesion layer may also conduct electricity between printed circuit board 102 and one or more electrical components. As used herein, an adhesion layer may comprise electrically conductive paste, electrically conductive glue, or any other suitable material. Although not shown in the example of FIG. 1, printed circuit board 102 may include one or more surface mounted electronic devices. Such surface mounted electronic devices may mount to printed circuit board 102 and electrically connect to metal layer 130.

Electrical connections between electronic components of printed circuit board 102 may be formed by soldering. Soldering components to form electrical connections may include placing solder between the components, applying heat to melt the solder, and allowing the solder to cool to form the electrical connection. The electrical components of printed circuit board 102 may also be glued or adhered together with conductive paste, conductive tape, conductive epoxy, and/or metal sintering. The connections between electrical components may include metalized plated laser vias, solder, and/or high-pressure/high-frequency metalized bonding such as diffusion bonding. Diffusion bonding may include direct bonding between electrical components, each of which may be a semiconductor die.

Metal layer 130 may be formed of an electrically conductive material. Example of an electrically conductive material may include, but are not limited to, copper, or another electrically conductive material. Metal layer 130 may include one or more of an embedded metal layers, traces, a metallization layer, a clip, a ribbon, a die paddle, a wire bond, a copper pillar, a through-silicon via, a lead frame segment, and/or any other suitable metal component. It should be understood that electrically conductive material of metal layer 130 may form connections between embedded integrated circuit 110 and contact pads 120-124. Such connections may be formed using metalized plated laser vias, solder, and/or high-pressure/high-frequency metalized bonding such as diffusion bonding.

Printed circuit board 102 may include one or more additional metal layers (not shown). Moreover, it should be understood that printed circuit board 102 may include one or more vias for connecting between different metal layers of printed circuit board 102. In some examples, however, printed circuit board 102 may include a single layer (e.g., metal layer 130).

Embedded integrated circuit 110 may be a semiconductor package that includes one or more semiconductor devices. Examples of semiconductor devices may include, but are not limited to, diodes, transistors, or another semiconductor device. Examples of transistors may include, but are not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that transistors may include a high side switch or low side switch. Additionally, transistors may be voltage-controlled and/or current-controlled. Examples of current-controlled transistors may include, but are not limited to, gallium nitride (GaN) MOSFETs, BJTs, or other current-controlled transistors. In some examples, embedded integrated circuit 110 may include more than two transistors, such as in multi-phase power converters or other more complex power circuits. For example, in a multi-phase power converter, embedded integrated circuit 110 may have one high-side transistor and one low-side transistor for each phase of a power converter.

Embedded integrated circuit 110 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, embedded integrated circuit 110 may be a combination of one or more analog components and one or more digital components For example, in some cases, integrated circuit 110 may include one or more transistors in combination with control circuitry for controlling the gates of the transistors. In some cases, integrated circuit 110 may include two transistors that form a half bridge, possibly with a controller within integrated circuit 110. In some examples, integrated circuit 110 may include transistors and a controller formed on the same chip, an in other examples, integrated circuit 110 may include transistors and a controller formed in separate and discrete chips.

Embedded integrated circuit 110 may be fully or partially encapsulated in a molding compound and/or any other suitable insulating material of printed circuit board 102. For example, embedded integrated circuit 110 may be fully or partially encapsulated in a core layer of printed circuit board 102.

Contact pads 120-124 may be configured for drilling. For example, as shown, contact pads 120-124 may be spaced apart from embedded integrated circuit 110. Moreover, as shown, contact pads 120-124 are formed having a substantially wider width than traces of metal layer 130. Further, contact pads 120-124 are arranged along an edge of printed circuit board 102.

Figure 2:
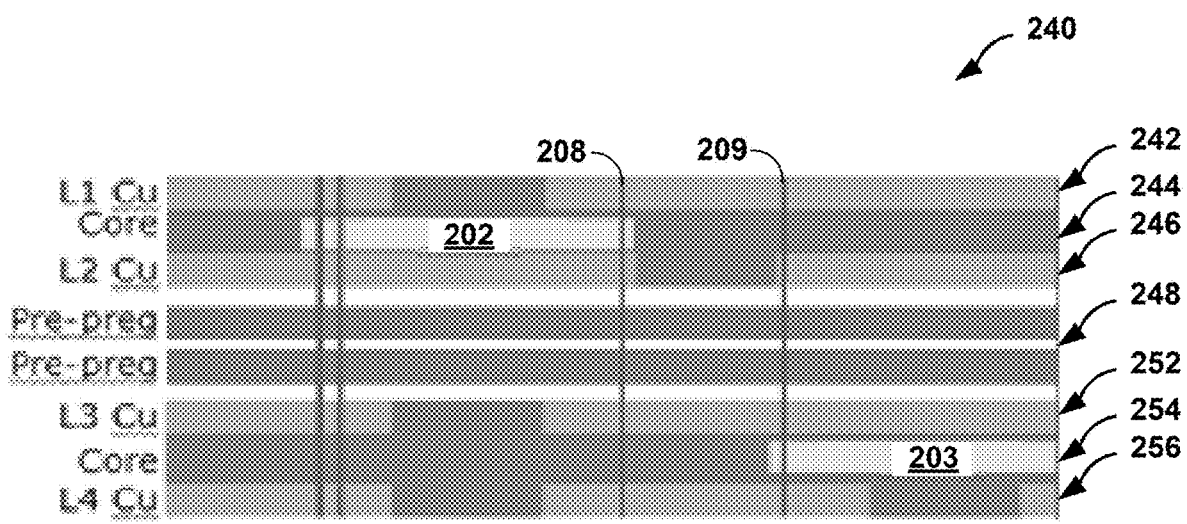
FIG. 2 is a side-view diagram of a printed circuit board that includes an embedded printed circuit board and drilled vias, in accordance with some examples of this disclosure.

FIG. 2 is a side-view diagram of a printed circuit board 240 that includes an embedded printed circuit board 202 and drilled vias 208 and 209, in accordance with some examples of this disclosure. In the example of FIG. 2, printed circuit board 102 may be an example of embedded printed circuit board 202 and embedded printed circuit board 203. For example, printed circuit board 202 may include an embedded integrated circuit electrically connected to one or more contacts pads by a metal layer. As shown, printed circuit board 240 may include metal layers 242, 246, 252, and 256, core layers 244, and 254, and pre-impregnated (also referred to herein as "pre-preg") layer 248. Metal layers 242, 246, 252, and 256 may be substantially similar to metal layer 130 of FIG. 1. For example, metal layers 242, 246, 252, and 256 may be formed of an electrically conductive material. While the example of FIG. 2 illustrates two embedded printed circuit boards, it should be understood that fewer (e.g., 1) or additional embedded printed circuit boards (e.g., 3 or more) may be used in other examples.

Core layers 244 and 254 may be formed of a nonconductive substrate. For example, core layers 244 and 254 may each include one or more dielectric layers. As shown, core layer 244 spaces apart embedded printed circuit board 202 from metal layers 242 and 246. Similarly, core layer 254 spaces apart embedded printed circuit board 203 from metal layers 252 and 256. Core layers 244 and 254 may include a substantially planar prefabricated board including a nonconductive substrate material.

In an exemplary process of FIG. 2, after forming core layer 244, the process forms metal layer 246 below core layer 244 and forms metal layer 242 above core layer 244. For instance, as shown, the process may form metal layer 242 directly onto an upper surface of core layer 244. It should be understood that forming a first layer directly onto a second layer may include applying one or more materials for bonding the first and second layers together. Moreover, as shown, the process may form metal layer 246 directly onto a lower surface of core layer 244.

Similarly, after forming core layer 254, the process forms metal layer 256 below core layer 254 and forms metal layer 252 above core layer 254. For instance, as shown, the process may form metal layer 252 directly onto an upper surface of core layer 254. Moreover, as shown, the process may form metal layer 256 directly onto a lower surface of core layer 254.

Pre-impregnated layer 248 may mechanically couple metal layers 246 and 252 while electronically isolating metal layers 246 and 252. For example, the process may form pre-impregnated layer 248 directly onto a lower surface of metal layer 246. Similarly, the process may form pre-impregnated layer 248 directly onto an upper surface of metal layer 252.

Drilled vias 208 and 209 may be formed by drilling into printed circuit board 240 to form cavities and forming an electrically conductive material into the cavities. As shown, drilled via 208 extends through embedded printed circuit board 202. In this way, drilled via 208 may electronically couple embedded printed circuit board 202 to metal layers 242, 246, 252, and 256. Similarly, drilled via 209 extends through embedded printed circuit board 203. In this way, drilled via 209 may electronically couple embedded printed circuit board 203 to metal layers 242, 246, 252, and 256.

Further processing may be performed on printed circuit board 240. For example, one or more surface mounted electronic devices may be mounted onto printed circuit board 240. Moreover, a dielectric layer may be formed on a top surface of printed circuit board 240. Similarly, a dielectric layer may be formed on a bottom surface of printed circuit board 240. It should be understood that embedded printed circuit boards 202 and/or 203 may include surface mounted electronic devices. For example, embedded printed circuit board 202 may include one or more surface mounted electronic devices. Additionally, or alternatively, embedded printed circuit board 203 may include one or more surface mounted electronic devices.

In accordance with the techniques of this disclosure, printed circuit board 240 may be an example of a semiconductor device that includes a first printed circuit board, a second printed circuit board, and one or more drilled vias. The first printed circuit board includes an embedded integrated circuit, one or more metal layers, and one or more contact pads. The embedded integrated circuit is electrically connected, by the one or more metal layers, to the one or more contact pads. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

FIGS. 3A-3F are side-view diagrams illustrating a process for chip embedding into a printed circuit board with drilling, in accordance with some examples of this disclosure. The process illustrated by FIGS. 3A-3F may be performed by a printed circuit board manufacturer.

Figure 3A:
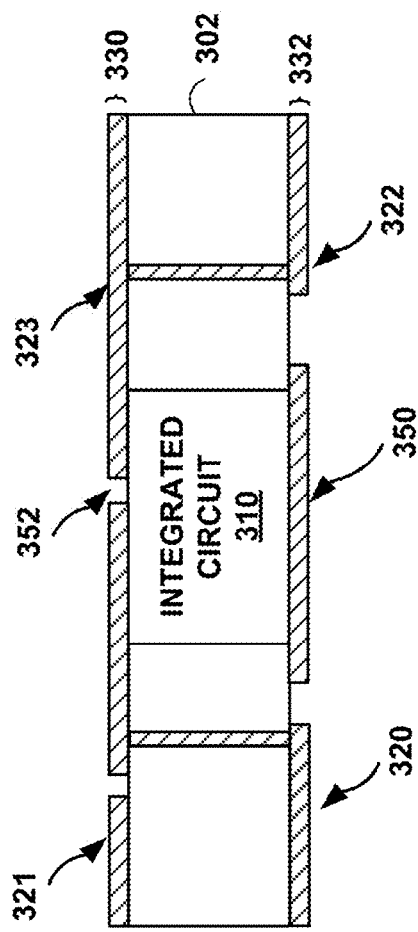

In the example of FIG. 3A, the process provides printed circuit board 302. As shown in FIG. 3A, printed circuit board 302 includes an embedded integrated circuit 310, metal layers 330 and 332, and contact pads 320 and 322. Although, the exemplary process of FIGS. 3A-3F illustrates two contact pads, in other examples may include fewer contact pads (e.g., one contact pad), or additional contact pads (e.g., two or more contact pads). As shown, contact pads 320 and 322 may be arranged on bottom surface 350. Additionally or alternatively, contact pads may be arranged on top surface 352. For example, as shown, printed circuit board 302 may include contact pads 321 and 323 that are arranged on top surface 352. It should be understood that the process illustrated in FIGS. 3A-3F for contact pads 320 and 322 may be substantially similar for contact pads 321 and 323. In some examples, contact pads 321 and 323 may be omitted and contact pads 320 and 322 may be included in printed circuit board 302. Similarly, in some examples, contact pads 320 and 322 may be omitted and contact pads 321 and 323 may be included in printed circuit board 302.

It should be understood that printed circuit board 302 may be manufactured using a different manufacturing process than the manufacturing process illustrated in FIGS. 3A-3F. For instance, printed circuit board 302 may be manufactured using a relatively narrow pitch manufacturing process and process 400 may be performed using a relatively wide pitch manufacturing process. Examples of a wide pitch manufacturing process may include a manufacturing process that generates a via size of greater than 200 micrometers ($\mu m$), a manufacturing process that generates generate a via to via pitch of greater than 300 micrometers ($\mu m$), or another wide pitch manufacturing process. Examples of a narrow pitch manufacturing process may include a manufacturing process that generates a via size of less than 200 micrometers ($\mu m$) using a drill, a manufacturing process that generates a via size of less than 100 micrometers ($\mu m$) using laser drill, a manufacturing process that generates generate a narrow pitch (via to via) of 200 micrometers ($\mu m$) or less, or another narrow pitch manufacturing process.

Figure 3B:
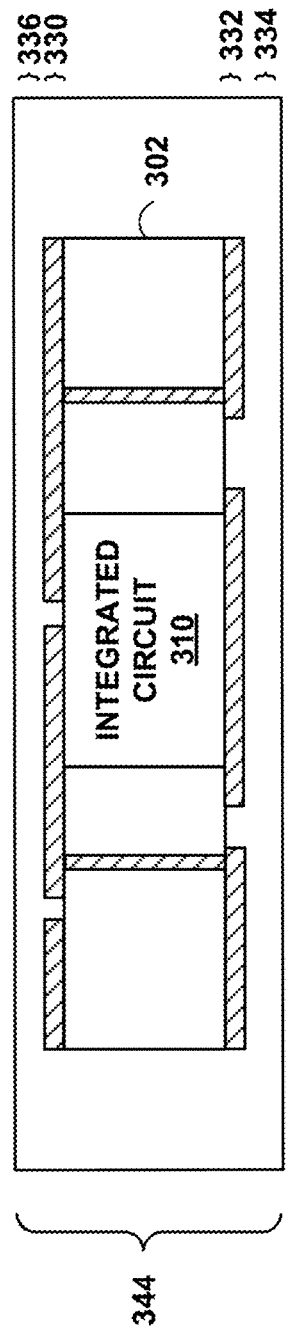

In the example of FIG. 3B, the process embeds printed circuit board 302 into core layer 344. For example, the process illustrated by FIG. 3B may form a non-conductive substrate around the printed circuit board 302. For instance, the process may apply material for the non-conductive substrate directly onto a bottom surface, top surface, and side surfaces of printed circuit board 302. In some examples, the process may form a portion of core layer 344 having an aperture which is sized and shaped to receive printed circuit board 302 and arrange printed circuit board 302 into the aperture. For instance, the process may cut the aperture into a substantially coplayer portion of core layer 344 and arrange printed circuit board 302 into the aperture. In some instances, the process may directly form portion of core layer 344 with the aperture. In any case, the process may form dielectric layer 334 under printed circuit board 302. It should be understood that printed circuit board 302 may omit surface mountable contacts and instead rely on contact pads 320 and 322 to electrically connect printed circuit board 302. In this example, the process may form a portion of core layer 344 over printed circuit board 302 such that printed circuit board 302 is encapsulated by core layer 344. For instance, the process may form dielectric layer 336 over printed circuit board 302.

Figure 3C:
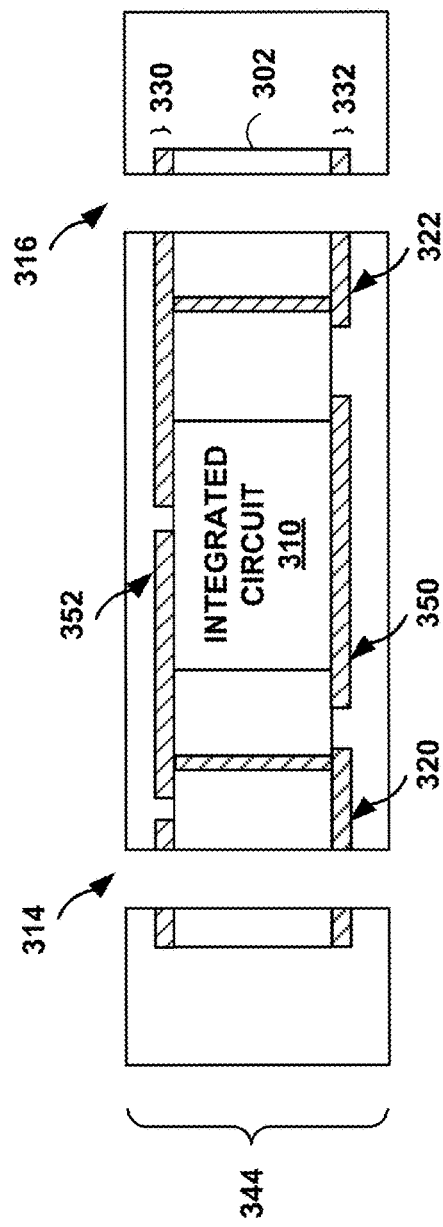

In the example of FIG. 3C, the process drills cavity 314 into contact pad 320 and drills cavity 316 into contact pad 322. As shown, cavity 314 may extend through top surface 352 of printed circuit board 302 to bottom surface 350 of printed circuit board 302. Moreover, cavity 314 may extend through core layer 344. Similarly, cavity 316 may extend through top surface 352 of printed circuit board 302 to bottom surface 350 of printed circuit board 302. Additionally, cavity 316 may extend through core layer 344.

Figure 3D:
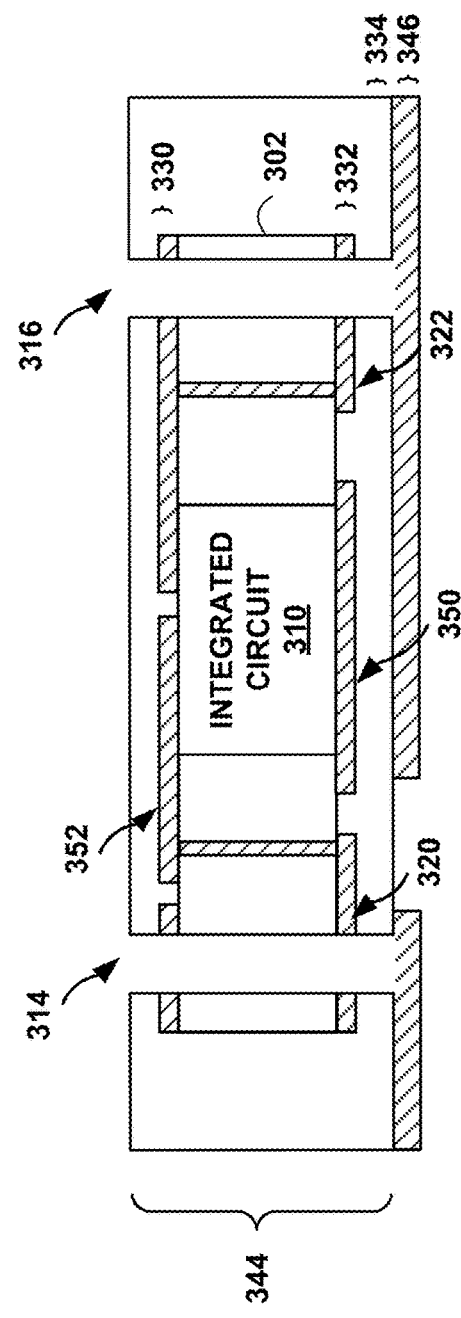

In the example of FIG. 3D, the process forms first metal layer 346 for a second printed circuit board below bottom surface 350 of printed circuit board 302B. As shown, dielectric layer 334 spaces apart metal layer 332 from metal layer 346. Although the example of FIG. 3D includes one metal layer (e.g., metal layer 332) below bottom surface 350, it should be understood that in some examples more than one metal layer may be formed below bottom surface 350.

In the example of FIG. 3E, the process forms drilled vias 364 and 366. For example, the process forms drilled via 364 by providing an electrically conductive material in the cavity 314 of FIG. 3D. Similarly, the process forms drilled via 366 by providing an electrically conductive material in the cavity 316 of FIG. 3C. Contact pads 320 and 322 may be formed of the same conductive materials as the electrically conductive material used for forming the drilled vias 364 and 366. By using the same electrically conductive material to form via 364 as contact pad 320, the connection between contact pad 320 and drilled via 364 may not need soldering. Similarly, by using the same electrically conductive material to form via 366 as contact pad 322, the connection between contact pad 322 and drilled via 366 may not need soldering. Although the example of FIG. 3E illustrates that metal layer 346 may be electrically coupled to drilled via 364 and drilled via 366, in some examples, metal layer 346 may be electrically isolated from drilled via 364 and/or drilled via 366.

In the example of FIG. 3F, the process forms metal layer 342 above top surface 352 of printed circuit board 302 to form printed circuit board 340. As shown, dielectric layer 336 spaces apart metal layer 330 from metal layer 342. Although the example of FIG. 3F includes one metal layer (e.g., metal layer 342) above top surface 352, it should be understood that in some examples more than one metal layer may be formed above top surface 352. Additionally, although the example of FIG. 3F illustrates that metal layer 342 may be electrically coupled to drilled via 364 and drilled via 366, in some examples, metal layer 342 may be electrically isolated from drilled via 364 and/or drilled via 366.

It should be understood that further processing may be performed on printed circuit board 340. For example, one or more surface mounted electronic devices may be mounted onto printed circuit board 340. Such surface mounted electronic devices may mount to printed circuit board 340 and electrically connect to one or more of metal layers 330, 332, 342, and 346. Additionally, or alternatively, such surface mounted electronic devices may mount to printed circuit board 340 and electrically connect to one or more of drilled vias 364 and 366. Moreover, a dielectric layer may be formed on a top surface of printed circuit board 340. Similarly, a dielectric layer may be formed on a bottom surface of printed circuit board 340.

Although FIGS. 3A-3F illustrate metal layers 330 and 332 being electrically coupled to drilled vias 364 and 366, in some examples only one or more top layers may be electrically coupled to drilled vias 364 and 366. For instance, contact pads 320 and 322 may be omitted. In some examples, only one or more bottom layers may be electrically coupled to drilled vias 364 and 366. For instance, contact pads 321 and 323 may be omitted.

In accordance with the techniques of this disclosure, printed circuit board 340 may be an example of a semiconductor device that includes a first printed circuit board, a second printed circuit board, and one or more drilled vias. The first printed circuit board includes an embedded integrated circuit, one or more metal layers, and one or more contact pads. The embedded integrated circuit is electrically connected, by the one or more metal layers, to the one or more contact pads. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

Figure 4:
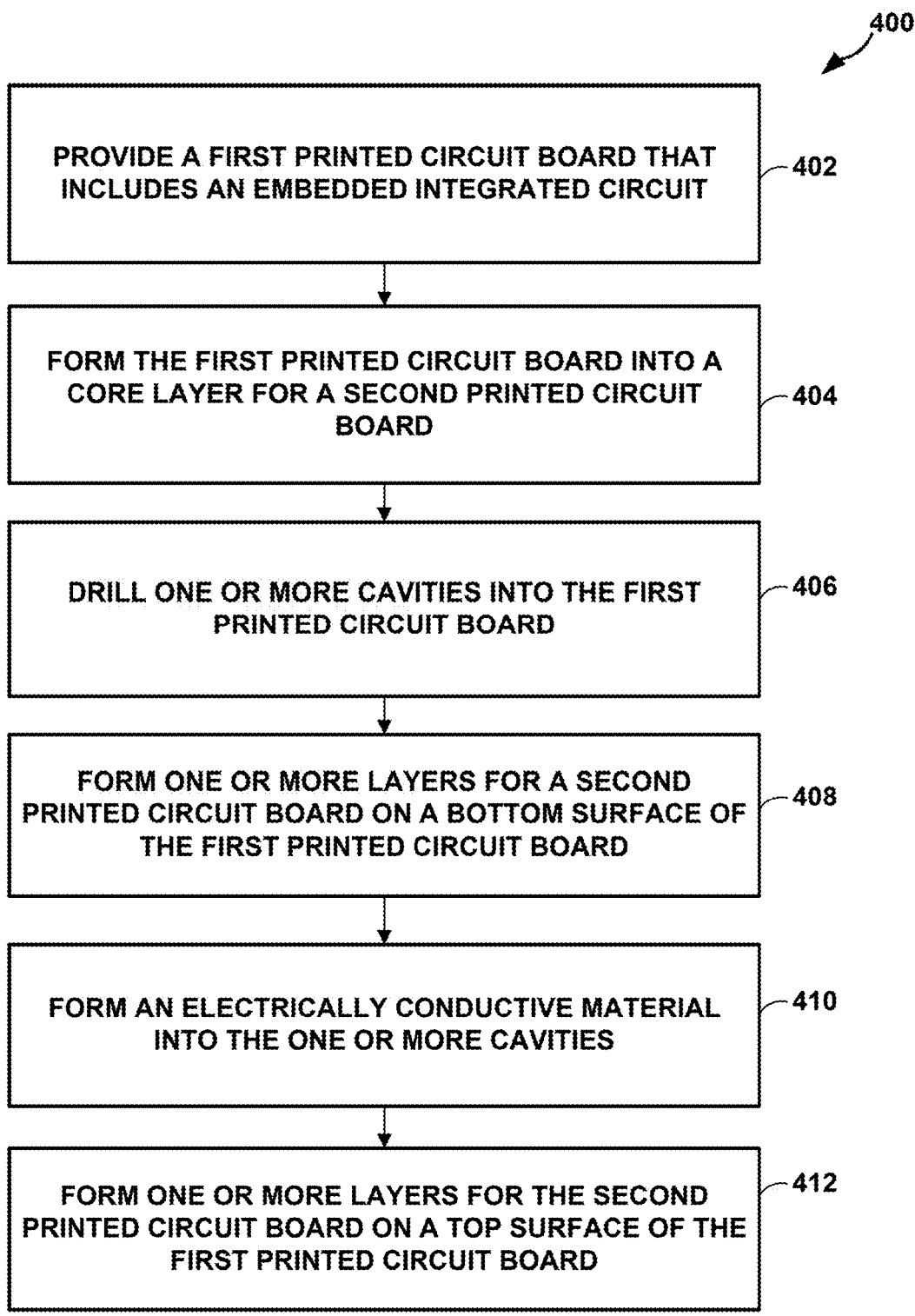
FIG. 4 is a flowchart illustrating an example process for constructing a device with a drilled vias in accordance with some examples of this disclosure.

FIG. 4 is a flowchart illustrating an example process for constructing a device with a drilled vias in accordance with some examples of this disclosure. The process of FIG. 4 is described with reference to FIGS. 3A-3F for exemplary purposes only.

Process 400 provides a first printed circuit board that includes an embedded integrated circuit (402). For example, printed circuit board 302 of FIG. 3A may be manufactured using a narrow pitch manufacturing process. Process 400 forms the first printed circuit board into a core layer for a second printed circuit board (404). For example, a wide pitch manufacturing process bonds a dielectric onto a bottom and top surface of printed circuit board 302 of FIG. 3A such that printed circuit board 302 is encapsulated by the dielectric.

Process 400 drills one or more cavities into the first printed circuit board (406). For example, the wide pitch manufacturing process drills into contact pad 320 to form cavity 314 of FIG. 3C. Similarly, the wide pitch manufacturing process may drill into contact pad 322 to form cavity 316 of FIG. 3C.

Process 400 forms one or more layers for a second printed circuit board on a bottom surface of the first printed circuit board (408). For example, the wide pitch manufacturing process forms metal layer 346 of FIG. 3D below bottom surface 350 of printed circuit board 302. Process 400 forms an electrically conductive material into the one or more cavities (410). For example, the wide pitch manufacturing process forms drilled via 364 of FIG. 3E by providing an electrically conductive material in the cavity 314 of FIG. 3D. Similarly, the wide pitch manufacturing process forms drilled via 366 of FIG. 3E by providing an electrically conductive material in the cavity 316 of FIG. 3D. Process 400 forms one or more layers for a second printed circuit board on a top surface of the first printed circuit board (412). For example, the wide pitch manufacturing process forms metal layer 342 of FIG. 3F above top surface 352 of printed circuit board 302 to form printed circuit board 340.

It should be understood that although process 400 drills the one or more cavities into the first printed circuit board before forming the first metal layer for the second printed circuit board, in some examples, drilling the one or more cavities into the first printed circuit board may be performed after forming the first metal layer for the second printed circuit board. For example, as shown in FIG. 2, some processes may drill one or more cavities into the first printed circuit board after forming the first metal layer for the second printed circuit board (and after forming the second metal layer for the second printed circuit board). For instance, in the example of FIG. 2, a process may drill cavities for drilled vias 208 and 209 by drilling into printed circuit board 240. In this way, drilled via 208 may extend through at least a portion of the second printed circuit board. For instance, drilled vias 208 and 209 of FIG. 2 may extend through metal layers 242, 246, 252, and 256 of printed circuit board 240.

In accordance with the techniques of this disclosure, process 400 may be an example of a method that includes drilling a cavity into each contact pad of one or more contact pads of a first printed circuit board to form one or more cavities. The first printed circuit board includes an embedded integrated circuit and one or more metal layers. The embedded integrated circuit is electrically connected, by the one or more metal layers, to the one or more contact pads. The method further includes forming one or more first metal layers for a second printed circuit board below a bottom surface of the first printed circuit board. One or more first dielectric layers space apart the one or more metal layers of the first printed circuit board from the one or more first metal layers for the second printed circuit board. The method further includes forming an electrically conductive material in the one or more cavities. The electrically conductive material electrically couples the one or more contact pads of the first printed circuit board to the second printed circuit board. The method further includes forming one or more second metal layers for the second printed circuit board above a top surface of the first printed circuit board. The top surface is opposite to the bottom surface. One or more second dielectric layers space apart the one or more metal layers of the first printed circuit board from the one or more second metal layers for the second printed circuit board.

Figure 5:
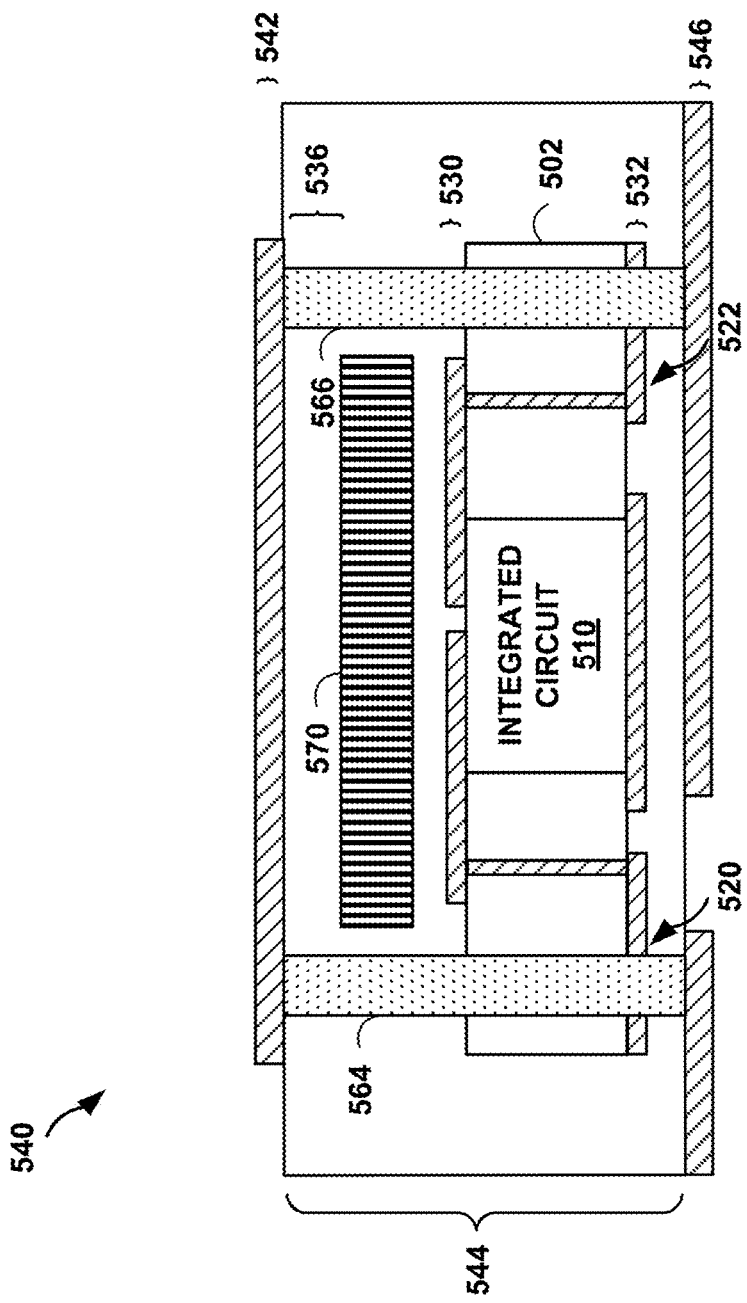
FIG. 5 is a side-view diagram illustrating a printed circuit board with drilled vias and a metal core, in accordance with some examples of this disclosure.

FIG. 5 is a side-view diagram illustrating printed circuit board 540 with drilled vias 564 and 566 and metal core 570, in accordance with some examples of this disclosure. As shown, printed circuit board 540 may include a core layer 544, metal layers 542 and 546, drilled vias 564 and 566, and printed circuit board 502. Core layer 544 may be substantially similar to core layer 344 of FIGS. 3A-3F. For example, core layer 544 may be formed of a non-conductive substrate. Metal layers 542 and 546 may be substantially similar to metal layers 342 and 346 of FIGS. 3A-3F. For example, metal layers 542 and 546 may be formed of an electrically conductive material. Drilled vias 564 and 566 may be substantially similar to drilled vias 364 and 366, respectively, of FIGS. 3A-3F. For example, drilled vias 564 and 566 may be formed by drilling cavities and providing an electrically conductive material into the cavities. While the example of FIG. 5 illustrates one embedded printed circuit boards, it should be understood that additional embedded printed circuit boards (e.g., or more) may be used in other examples.

Printed circuit board 502 may include an embedded integrated circuit 510 electrically connected to contacts pads 520 and 522 by metal layers 530 and 532. Embedded integrated circuit 510, contacts pads 520 and 522, and metal layers 530 and 532 may be substantially similar to embedded integrated circuit 310, contacts pads 320 and 322, and metal layers 330 and 332, respectively of FIGS. 3A-3F. However, printed circuit board 502 may further include metal core 570. Additionally, or alternatively, printed circuit board 502 may include contact pads arranged on a top surface of printed circuit board 502 that are substantially similar to contact pads 321 and 323 of FIG. 3.

Metal core 570 may be attached to printed circuit board 502 using an adhesion layer. Such an adhesion layer may also conduct electricity between printed circuit board 502 and one or more electrical components. Moreover, as shown, metal core 570 may be may be fully encapsulated in a molding compound and/or any other suitable insulating material of printed circuit board 540. For example, metal core 570 may be fully or partially encapsulated in core layer 544 of printed circuit board 540.

Metal core 570 may be an inductor. As such, metal core 570 may impede the flow of alternating-current (AC) electricity, while allowing direct current (DC) electricity to flow through metal core 570. In some examples, metal core 570 may be electrically coupled to integrated circuit 510, In some examples, metal core 570 may be electrically isolated from printed circuit board 540. For instance, dielectric layer 536 may electrically isolate printed circuit board 540 from metal core 570.

In accordance with the techniques of this disclosure, printed circuit board 540 may be an example of a semiconductor device that includes a first printed circuit board, a second printed circuit board, and one or more drilled vias. The first printed circuit board includes an embedded integrated circuit, one or more metal layers, and one or more contact pads. The embedded integrated circuit is electrically connected, by the one or more metal layers, to the one or more contact pads. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

Figure 6:
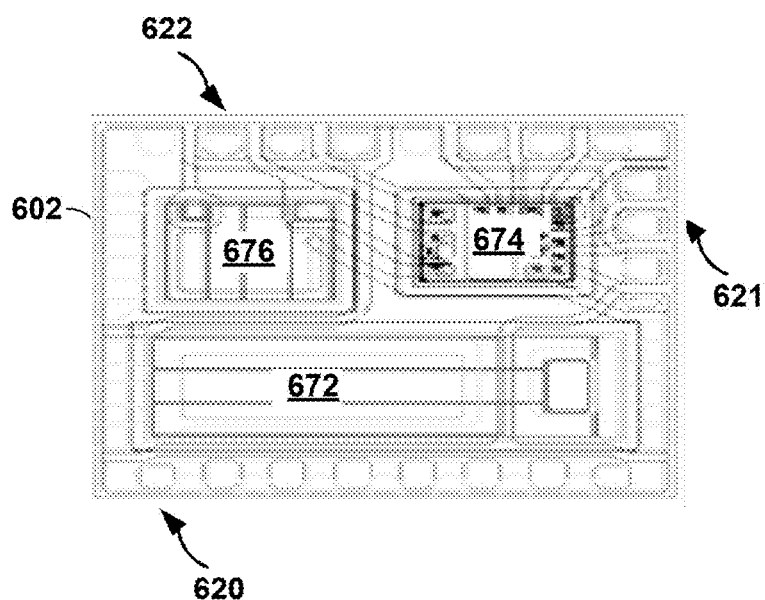
FIG. 6 is a top-view diagram of a printed circuit board with contact pads configured for drilling, in accordance with some examples of this disclosure.

FIG. 6 is a top-view diagram of a printed circuit board 602 with contact pads 620-622 configured for drilling, in accordance with some examples of this disclosure. In the example of FIG. 6, printed circuit board 602 may be an example of printed circuit board 302. Printed circuit board 602 may include dies 672, 674, and 676. For example, die 672 includes an embedded integrated circuit. In some examples, die 674 may include one or more transistors. In some examples, die 676 may include one or more transistors. In the example of FIG. 6, contact pad 620 is electrically connected to die 672 by the one or more metal layers. Similarly, in some examples, contact pad 621 is electrically connected to die 674 by the one or more metal layers. Further, in some examples, contact pad 622 is electrically connected to die 676 by the one or more metal layers.

Printed circuit board 602 may be configured for any suitable application. For example, die 672 may include embedded integrated circuit electrically for voltage regulation. In this example, dies 674 and 676 may include transistors for switching a switching power converter for voltage regulation. In some examples, die 672 may include embedded integrated circuit electrically for controlling a half-bridge or power stage converter. In this example, dies 674 and 676 may include transistors for the half-bridge or power stage converter.

Figure 7:
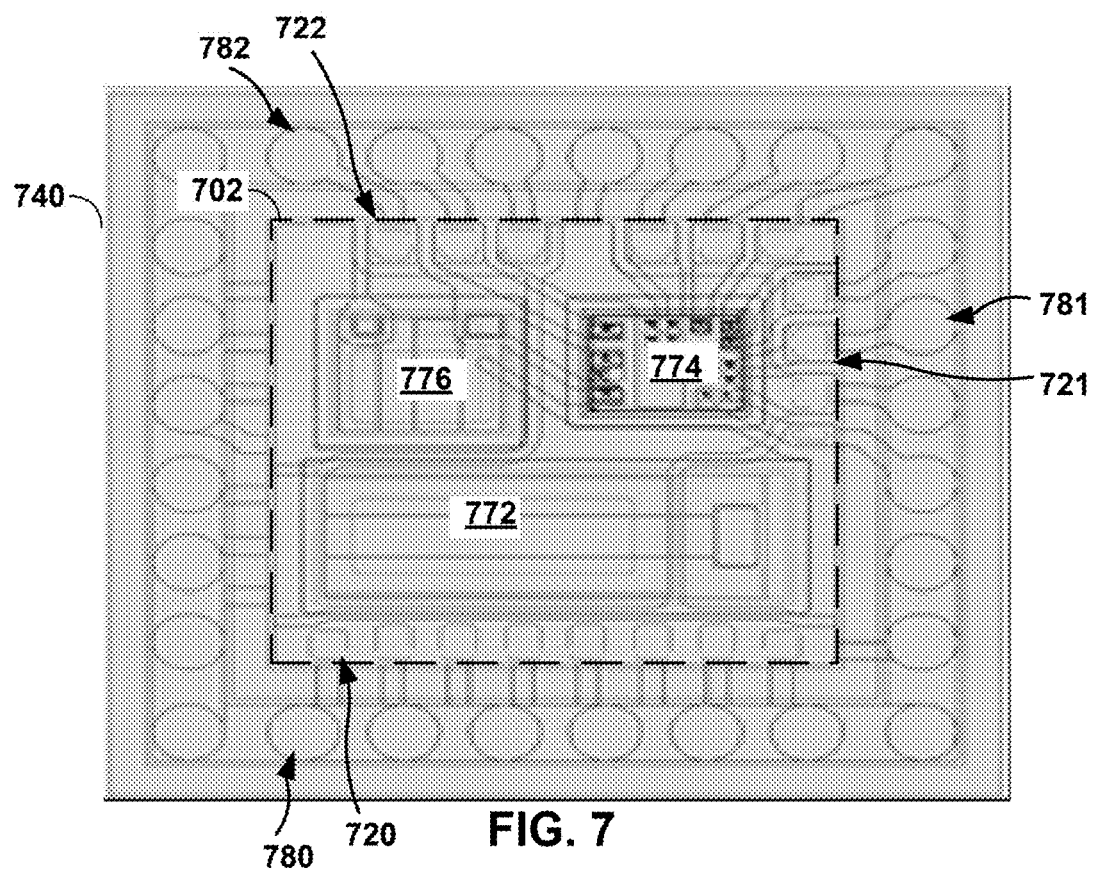
FIG. 7 is a top-view diagram of a printed circuit board with an embedded printed circuit, in accordance with some examples of this disclosure.

FIG. 7 is a top-view diagram of printed circuit board 740 with an embedded printed circuit board 702, in accordance with some examples of this disclosure. In the example of FIG. 7, printed circuit board 740 may be an example of printed circuit board 340. Printed circuit board 740 may include printed circuit board 702 and contact pads 780-782.

Printed circuit board 702 may substantially similar to printed circuit board 602 of FIG. 6. In the example of FIG. 7, printed circuit board 702 may include die 772 that includes an embedded integrated circuit, die 774 that includes a transistor, and die 776 that includes a transistor. In this example, contact pad 720 may be drilled to form a cavity, which may be filled with an electrically conductive material to form a drilled via. Similarly, contact pad 721 may be drilled to form a cavity, which may be filled with an electrically conductive material to form a drilled via. Further, contact pad 722 may be drilled to form a cavity, which may be filled with an electrically conductive material to form a drilled via.

In the example of FIG. 7, contact pad 780 is electrically connected to contact pad 720 by the one or more metal layers. Similarly, in some examples, contact pad 781 is electrically connected to contact pad 721 by the one or more metal layers. Further, in some examples, contact pad 782 is electrically connected to contact pad 722 by the one or more metal layers.

It should be understood that drilled vias may be formed into contact pads 780-782. For example, contact pad 780 may be drilled to form a cavity, which may be filled with an electrically conductive material to form a drilled via. Similarly, contact pad 781 may be drilled to form a cavity, which may be filled with an electrically conductive material to form a drilled via. Further, contact pad 782 may be drilled to form a cavity, which may be filled with an electrically conductive material to form a drilled via. In this way, printed circuit board 740 may be embedded into another printed circuit board (not shown).

In accordance with the techniques of this disclosure, printed circuit board 740 may be an example of a semiconductor device that includes a first printed circuit board, a second printed circuit board, and one or more drilled vias. The first printed circuit board includes an embedded integrated circuit, a second die that includes a transistor, one or more metal layers, and one or more contact pads. The first die and the second die are electrically connected, by the one or more metal layers, to the one or more contact pads. The first printed circuit board has a top surface and a bottom surface that is opposite to the top surface. The first printed circuit board has a top surface and a bottom surface that is opposite to the top surface. The second printed circuit board includes one or more first metal layers arranged below the bottom surface. One or more first dielectric layers space apart the one or more first metal layers for the second printed circuit board from the one or more metal layers of the first printed circuit board. The second printed circuit board further includes one or more second metal layers arranged above the top surface. One or more second dielectric layers space apart the one or more second metal layers for the second printed circuit board from the one or more metal layers of the first printed circuit board. Each one of the one or more drilled vias extends from the bottom surface, through a respective contact pad of the one or more contact pads, to the top surface and includes an electrically conductive material that electrically couples a respective contact pad of the one or more contact pads of the first printed circuit board to the second printed circuit board.

The following examples may illustrate one or more aspects of the disclosure.

Example 1

A method comprising: drilling a cavity into each contact pad of one or more contact pads of a first printed circuit board to form one or more cavities, wherein the first printed circuit board comprises an embedded integrated circuit and one or more metal layers and wherein the embedded integrated circuit is electrically connected, by the one or more metal layers, to the one or more contact pads; forming one or more first metal layers for a second printed circuit board below a bottom surface of the first printed circuit board, wherein one or more first dielectric layers space apart the one or more metal layers of the first printed circuit board from the one or more first metal layers for the second printed circuit board; forming an electrically conductive material in the one or more cavities, the electrically conductive material electrically coupling the one or more contact pads of the first printed circuit board to the second printed circuit board; and forming one or more second metal layers for the second printed circuit board above a top surface of the first printed circuit board, wherein the top surface is opposite to the bottom surface and wherein one or more second dielectric layers space apart the one or more metal layers of the first printed circuit board from the one or more second metal layers for the second printed circuit board.

Example 2

The method of example 1, wherein the electrically conductive material electrically couples the one or more contact pads of the first printed circuit board to the one or more first metal layers.

Example 3

The method of any combination of examples 1-2, wherein the electrically conductive material electrically couples the one or more contact pads of the first printed circuit board to the one or more second metal layers.

Example 4

The method of any combination of examples 1-3, wherein the one or more metal layers of the first printed circuit board have a narrower pitch than the one or more first metal layers for the second printed circuit board and wherein the one or more metal layers of the first printed circuit board have a narrower pitch than the one or more second metal layers for the second printed circuit board.

Example 5

The method of any combination of examples 1-4, wherein the one or more metal layers of the first printed circuit board are a plurality of metal layers of the first printed circuit board and wherein drilling the cavity into each contact pad of the one or more contact pads comprises drilling through the plurality of metal layers.

Example 6

The method of any combination of examples 1-5, wherein the first printed circuit board comprises a metal core and wherein forming the one or more second metal layers comprises embedding the metal core into the second printed circuit board.

Example 7

The method of any combination of examples 1-6, wherein the metal core is electrically coupled to the embedded integrated circuit and wherein the metal core is electrically isolated from the second printed circuit board.

Example 8

The method of any combination of examples 1-7, wherein the metal core is an inductor.

Example 9

The method of any combination of examples 1-8, wherein the first printed circuit board comprises a third printed circuit board that is embedded into the first printed circuit board, the third printed circuit board comprising the embedded integrated circuit.

Example 10

A semiconductor device comprising: a first printed circuit board comprising an embedded integrated circuit, one or more metal layers, and one or more contact pads, the embedded integrated circuit being electrically connected, by the one or more metal layers, to the one or more contact pads, wherein the first printed circuit board has a top surface and a bottom surface that is opposite to the top surface; a second printed circuit board comprising: one or more first metal layers arranged below the bottom surface, wherein one or more first dielectric layers space apart the one or more first metal layers for the second printed circuit board from the one or more metal layers of the first printed circuit board; and one or more second metal layers arranged above the top surface, wherein one or more second dielectric layers space apart the one or more second metal layers for the second printed circuit board from the one or more metal layers of the first printed circuit board; and one or more drilled vias, each one of the one or more drilled vias extending from the bottom surface, through a respective contact pad of the one or more contact pads, to the top surface and including an electrically conductive material that electrically couples a respective contact pad of the one or more contact pads of the first printed circuit board to the second printed circuit board.

Example 11

The device of example 10, wherein the electrically conductive material electrically couples the one or more contact pads to the one or more first metal layers.

Example 12

The device of any combination of examples 10-11, wherein the electrically conductive material electrically couples the one or more contact pads to the one or more second metal layers.

Example 13

The device of any combination of examples 10-12, wherein the one or more metal layers of the first printed circuit board have a narrower pitch than the one or more first metal layers for the second printed circuit board and wherein the one or more metal layers of the first printed circuit board have a narrower pitch than the one or more second metal layers for the second printed circuit board.

Example 14

The device of any combination of examples 10-13, wherein the one or more metal layers of the first printed circuit board are a plurality of metal layers of the first printed circuit board and wherein the electrically conductive material extends through the plurality of metal layers.

Example 15

The device of any combination of examples 10-14, wherein the first printed circuit board comprises a metal core and wherein the one or more second metal layers embed the metal core into the second printed circuit board.

Example 16

The device of any combination of examples 10-15, wherein the metal core is electrically coupled to the embedded integrated circuit and wherein the metal core is electrically isolated from the second printed circuit board.

Example 17

The device of any combination of examples 10-16, wherein the metal core is an inductor.

Example 18

The device of any combination of examples 10-17, wherein the first printed circuit board comprises a third printed circuit board that is embedded into the first printed circuit board, the third printed circuit board comprising the embedded integrated circuit.

Example 19

A device comprising: a first printed circuit board comprising a first die that includes an embedded integrated circuit, a second die that includes a transistor, one or more metal layers, and one or more contact pads, wherein the first die and the second die are electrically connected, by the one or more metal layers, to the one or more contact pads and wherein the first printed circuit board has a top surface and a bottom surface that is opposite to the top surface; a second printed circuit board comprising: one or more first metal layers arranged below the bottom surface, wherein one or more first dielectric layers space apart the one or more first metal layers for the second printed circuit board from the one or more metal layers of the first printed circuit board; and one or more second metal layers arranged above the top surface, wherein one or more second dielectric layers space apart the one or more second metal layers for the second printed circuit board from the one or more metal layers of the first printed circuit board; and one or more drilled vias, each one of the one or more drilled vias extending from the bottom surface, through a respective contact pad of the one or more contact pads, to the top surface and including an electrically conductive material that electrically couples a respective contact pad of the one or more contact pads of the first printed circuit board to the second printed circuit board.

Example 20

The device of example 19, wherein the first printed circuit board comprises a third printed circuit board that is embedded into the first printed circuit board, the third printed circuit board comprising the first die and the second die.

Various aspects have been described in this disclosure. These and other aspects are within the scope of the following claims.

The invention claimed is:

1. A method comprising:
   drilling a cavity into each contact pad of one or more contact pads of a first printed circuit board to form one or more cavities, wherein the first printed circuit board comprises an embedded integrated circuit and one or more metal layers and wherein the embedded integrated circuit is electrically connected, by the one or more metal layers, to the one or more contact pads;
   forming one or more first metal layers for a second printed circuit board below a bottom surface of the first printed circuit board, wherein one or more first dielectric layers space apart the one or more metal layers of the first printed circuit board from the one or more first metal layers for the second printed circuit board;
   forming an electrically conductive material in the one or more cavities, the electrically conductive material electrically coupling the one or more contact pads of the first printed circuit board to the second printed circuit board; and
   forming one or more second metal layers for the second printed circuit board above a top surface of the first printed circuit board, wherein the top surface is opposite to the bottom surface, wherein one or more second dielectric layers space apart the one or more metal layers of the first printed circuit board from the one or more second metal layers for the second printed circuit board, and wherein forming the electrically conductive material comprises forming one or more drilled vias, each drilled via of the one or more drilled vias extending through and filling the cavity of a respective contact pad of the one or more contact pads with the electrically conductive material, the electrically conductive material surrounded by and directly contacting the cavity of the respective contact pad such that the respective drilled via electrically couples the respective contact pad of the one or more contact pads of the first printed circuit board to the second printed circuit board, wherein the first printed circuit board is entirely embedded within and surrounded by the second printed circuit board.

2. The method of claim 1, wherein the electrically conductive material electrically couples the one or more contact pads of the first printed circuit board to the one or more first metal layers.

3. The method of claim 1, wherein the electrically conductive material electrically couples the one or more contact pads of the first printed circuit board to the one or more second metal layers.

4. The method of claim 1, wherein the one or more metal layers of the first printed circuit board have a narrower pitch than the one or more first metal layers for the second printed circuit board and wherein the one or more metal layers of the first printed circuit board have a narrower pitch than the one or more second metal layers for the second printed circuit board.

5. The method of claim 1, wherein the one or more metal layers of the first printed circuit board are a plurality of metal layers of the first printed circuit board and wherein drilling the cavity into each contact pad of the one or more contact pads comprises drilling through the plurality of metal layers.

6. The method of claim 1, wherein the first printed circuit board comprises an inductor and wherein forming the one or more second metal layers comprises embedding the inductor into the second printed circuit board.

7. The method of claim 6, wherein the inductor is electrically coupled to the embedded integrated circuit and wherein the inductor is electrically isolated from the second printed circuit board.

8. The method of claim 1, wherein the first printed circuit board comprises a third printed circuit board that is embedded into the first printed circuit board, the third printed circuit board comprising the embedded integrated circuit.

9. A semiconductor device comprising:
a first printed circuit board comprising an embedded integrated circuit, one or more metal layers, and one or more contact pads, the embedded integrated circuit being electrically connected, by the one or more metal layers, to the one or more contact pads, wherein the first printed circuit board has a top surface and a bottom surface that is opposite to the top surface;
a second printed circuit board comprising:
one or more first metal layers arranged below the bottom surface, wherein one or more first dielectric layers space apart the one or more first metal layers for the second printed circuit board from the one or more metal layers of the first printed circuit board; and
one or more second metal layers arranged above the top surface, wherein one or more second dielectric layers space apart the one or more second metal layers for the second printed circuit board from the one or more metal layers of the first printed circuit board; and
one or more drilled vias, each drilled via of the one or more drilled vias extending through and filling a cavity formed within a respective contact pad of the one or more contact pads with an electrically conductive material, the electrically conductive material surrounded by and directly contacting the cavity of the respective contact pad of the one or more contact pads such that the respective drilled via electrically couples the respective contact pad of the one or more contact pads of the first printed circuit board to the second printed circuit board, wherein the first printed circuit board is entirely embedded within and surrounded by the second printed circuit board.

10. The device of claim 9, wherein the electrically conductive material electrically couples the one or more contact pads to the one or more first metal layers.

11. The device of claim 9, wherein the electrically conductive material electrically couples the one or more contact pads to the one or more second metal layers.

12. The device of claim 9, wherein the one or more metal layers of the first printed circuit board have a narrower pitch than the one or more first metal layers for the second printed circuit board and wherein the one or more metal layers of the first printed circuit board have a narrower pitch than the one or more second metal layers for the second printed circuit board.

13. The device of claim 9, wherein the one or more metal layers of the first printed circuit board are a plurality of metal layers of the first printed circuit board and wherein the electrically conductive material extends through the plurality of metal layers.

14. The device of claim 9, wherein the first printed circuit board comprises a metal core and wherein the one or more second metal layers embed the metal core into the second printed circuit board.

15. The device of claim 14, wherein the metal core is electrically coupled to the embedded integrated circuit and wherein the metal core is electrically isolated from the second printed circuit board.

16. The device of claim 9, wherein the first printed circuit board comprises an inductor and wherein the one or more second metal layers embed the inductor into the second printed circuit board.

17. The device of claim 16, wherein the inductor is electrically coupled to the embedded integrated circuit and wherein the inductor is electrically isolated from the second printed circuit board.

18. The device of claim 9, wherein the first printed circuit board comprises a third printed circuit board that is embedded into the first printed circuit board, the third printed circuit board comprising the embedded integrated circuit.

19. A semiconductor device comprising:
a first printed circuit board comprising a first die that includes an embedded integrated circuit, a second die that includes a transistor, one or more metal layers, and one or more contact pads, wherein the first die and the second die are electrically connected, by the one or more metal layers, to the one or more contact pads and wherein the first printed circuit board has a top surface and a bottom surface that is opposite to the top surface;
a second printed circuit board comprising:
one or more first metal layers arranged below the bottom surface, wherein one or more first dielectric layers space apart the one or more first metal layers for the second printed circuit board from the one or more metal layers of the first printed circuit board; and
one or more second metal layers arranged above the top surface, wherein one or more second dielectric layers space apart the one or more second metal layers for the second printed circuit board from the one or more metal layers of the first printed circuit board; and
one or more drilled vias, each drilled via of the one or more drilled vias extending through and filling a cavity formed within a respective contact pad of the one or more contact pads with an electrically conductive material, the electrically conductive material surrounded by and directly contacting the cavity of the respective contact pad of the one or more contact pads such that the respective drilled via electrically couples the respective contact pad of the one or more contact pads of the first printed circuit board to the second printed circuit board, wherein the first printed circuit board is entirely embedded within and surrounded by the second printed circuit board.

20. The device of claim 19, wherein the first printed circuit board comprises a third printed circuit board that is embedded into the first printed circuit board, the third printed circuit board comprising the first die and the second die.

* * * * *